(12) United States Patent
Joo et al.

(10) Patent No.: US 12,085,608 B2
(45) Date of Patent: Sep. 10, 2024

(54) PICKER DEVICE

(71) Applicant: INTEKPLUS CO., LTD., Daejeon (KR)

(72) Inventors: Byeong Gwon Joo, Daejeon (KR); Yoon Soo Kim, Daejeon (KR); Young Bo Kwak, Daejeon (KR); Ju Hun An, Daejeon (KR); Woo Ram Son, Sejong-si (KR)

(73) Assignee: INTEKPLUS CO., LTD., Daejeon (KR)

( * ) Notice: Subject to any disclaimer, the term of this patent is extended or adjusted under 35 U.S.C. 154(b) by 119 days.

(21) Appl. No.: 17/914,947

(22) PCT Filed: Jan. 19, 2021

(86) PCT No.: PCT/KR2021/000706
§ 371 (c)(1),
(2) Date: Sep. 27, 2022

(87) PCT Pub. No.: WO2021/201396
PCT Pub. Date: Oct. 7, 2021

(65) Prior Publication Data
US 2023/0152368 A1 May 18, 2023

(30) Foreign Application Priority Data

Apr. 1, 2020 (KR) .................. 10-2020-0039748
May 8, 2020 (KR) .................. 10-2020-0055002

(51) Int. Cl.
*G01R 31/28* (2006.01)
*H01L 21/683* (2006.01)

(52) U.S. Cl.
CPC ...... *G01R 31/2867* (2013.01); *H01L 21/6838* (2013.01)

(58) Field of Classification Search
CPC ............ G01R 31/2867; G01R 31/2893; H01L 21/6838; H01L 21/677; H01L 21/683; H01L 21/687; H01L 22/00; B65G 47/918
(Continued)

(56) References Cited

U.S. PATENT DOCUMENTS

| | | | |
|---|---|---|---|
| 7,023,197 B2 * | 4/2006 | Jung | ................. G01R 31/2887 324/757.01 |
| 8,146,969 B2 | 4/2012 | Yo et al. | |
| 8,376,431 B2 | 2/2013 | Na et al. | |

FOREIGN PATENT DOCUMENTS

| | | |
|---|---|---|
| JP | 2001-203497 A | 7/2001 |
| KR | 10-2003-0012438 A | 2/2003 |

(Continued)

OTHER PUBLICATIONS

International Written Opinion issued on Jul. 28, 2021 in counterpart Patent Application No. PCT/KR2021/000706 (4 pages in Korean).

*Primary Examiner* — Farhana A Hoque
(74) *Attorney, Agent, or Firm* — NSIP Law

(57) ABSTRACT

The present invention relates to a picker device. The pickers are arranged in a line on a picker support, and each of the pickers comprises: a main nozzle in which vacuum pressure is applied or released at the lower end; and a lift actuator supported by the picker support to lift and lower the main nozzle. A sub-nozzle docking module is docked or undocked with the main nozzles, and comprises: at least one sub-nozzle which adsorbs or desorbs an object to be transferred as vacuum pressure is applied or released at the lower end thereof; a docking mount which receives vacuum pressure from the main nozzles in a docked state with the main nozzles by supporting the sub-nozzle at the lower end thereof and delivers the vacuum pressure to the sub-nozzle through a vacuum passage; and an attachment/detachment (Continued)

mechanism for attaching and detaching the docking mount to and from the picker support.

7 Claims, 13 Drawing Sheets

(58) Field of Classification Search
USPC .................................................. 324/757.04
See application file for complete search history.

(56) References Cited

FOREIGN PATENT DOCUMENTS

| | | |
|---|---|---|
| KR | 10-0627300 B1 | 9/2006 |
| KR | 10-2009-0053582 A | 5/2009 |
| KR | 10-2010-0133297 A | 12/2010 |

\* cited by examiner

# PICKER DEVICE

CROSS REFERENCE TO RELATED APPLICATIONS

This application is a U.S. National Stage Application of International Application No. PCT/KR2021/000706, filed on Jan. 19, 2021, which claims the benefit under 35 USC 119(a) and 365(b) of Korean Patent Application No. 10-2020-0039748, filed on Apr. 1, 2020, and 10-2020-0055002, filed on May 8, 2020 in the Korean Intellectual Property Office, the entire disclosure of which is incorporated herein by reference for all purposes.

TECHNICAL FIELD

The present invention relates to a picker device, and more particularly, to a picker device used to transfer a transfer target object such as a semiconductor element.

BACKGROUND ART

In general, after semiconductor elements are manufactured through a semiconductor process, the semiconductor elements are tested before shipment. That is, when there are an internal defect of a semiconductor element wrapped with a package as well as an external defect thereof, the performance thereof is fatally affected. Accordingly, various tests including external defect inspections as well as electrical operation tests are performed on semiconductor elements.

A picker device may be configured to apply vacuum pressure to pickers arranged in at least one line to adsorb semiconductor elements and release the vacuum pressure from the pickers to detach the semiconductor elements. Sizes of semiconductor elements may vary for each type, and accordingly, a tray may be configured to accommodate semiconductor elements having various sizes according to a Joint Electron Device Engineering Council (JEDEC) standard.

In the tray, since an interval between tray pockets for accommodating semiconductor elements is changed according to the sizes of the semiconductor elements, a picker device may also be formed in a variable type in which an interval between pickers is adjusted according to the interval between the tray pockets.

Meanwhile, with the advancement of technology, semiconductor elements tend to have been miniaturized so as to be variously applied to next-generation electronic devices and the like. Accordingly, in a tray, an interval between tray pockets may be narrow to accommodate miniaturized semiconductor elements. In this case, the number of tray pockets in an arrangement direction of the pickers may be greater than the number of the pickers, and thus efficiency of transferring the semiconductor elements may decrease.

In order to solve such a problem, the number of pickers can be increased according to the number of tray pockets according to an arrangement direction of the pickers, but the size of the picker should be decreased according to an interval between the tray pockets. However, as the size of the picker decreases, the adsorptive power to a semiconductor element decreases, which makes it difficult to stably adsorb a relatively large semiconductor element.

DISCLOSURE

Technical Problem

The present invention is directed to providing a picker device capable of flexibly coping with a situation in which a transfer target object is accommodated in a tray.

Technical Solution

According to an embodiment of the present invention, a picker device includes a picker support, pickers, and a sub-nozzle docking module. The pickers are arranged in a line on the picker support and each include a main nozzle to which vacuum pressure is applied to or released from a lower end thereof and a lift actuator supported on the picker support to elevate the main nozzle. The sub-nozzle docking module is docked to or undocked from the main nozzles and includes one or more sub-nozzles configured to adsorb or desorb transfer target objects when vacuum pressure is applied to or released from lower ends thereof, a docking mount configured to support the sub-nozzles at a lower end portion thereof to receive the vacuum pressure from the main nozzles in a state of being docked to the main nozzles and transmit the vacuum pressure to the sub-nozzles through a vacuum passage, and an attachment/detachment mechanism configured to attach and detach the docking mount to and from the picker support.

Advantageous Effects

According to the present invention, even when small transfer target objects are accommodated in a tray at an interval less than an interval between main nozzles or large transfer target objects are accommodated in the tray at an interval greater than the interval between the main nozzles, only a sub-nozzle docking module suitable for each situation can be replaced to stably pick up and transfer the corresponding transfer target objects, thereby flexibly coping with a situation in which the transfer target objects are accommodated in the tray.

According to the present invention, even when there is some height deviation between main nozzles due to various factors such as an assembly error of each of pickers with respect to a picker support or an assembly error of the picker itself, minimum heights of the main nozzles can be set to be the same due to an interaction between locking protrusions and a stopper. As a result, when a vision inspection is performed in a state in which transfer target objects are picked up by the main nozzles, an accurate inspection can be performed on the transfer target objects.

In addition, according to the present embodiment, when only a height of each of locking protrusions and a stopper is managed, minimum heights of main nozzles can be set to be the same, thereby easily managing the heights of the main nozzles.

MODES OF THE INVENTION

Figure 1:
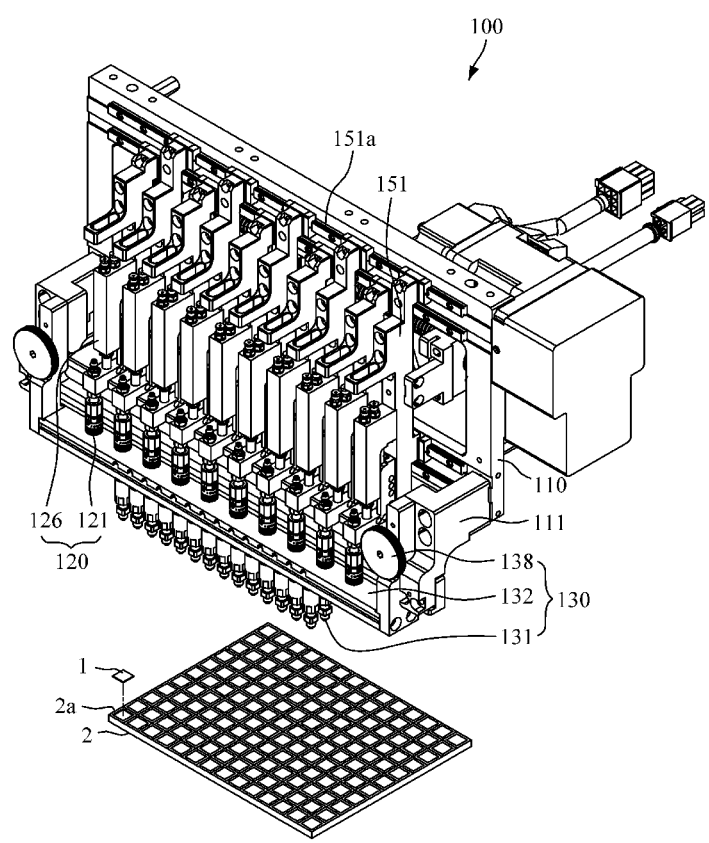
FIG. 1 is a perspective view of a picker device according to one embodiment of the present invention.

The present invention will be described in detail with reference to the accompanying drawings as follows. The same elements are assigned the same reference numerals. Repeated descriptions and descriptions of known functions and configurations which have been deemed to make the gist of the present invention unnecessarily obscure will be omitted below. The embodiments of the present invention are intended to fully describe the present invention to a person having ordinary knowledge in the art to which the present invention pertains. Accordingly, the shapes, sizes, and the like of elements in the drawings may be exaggerated to make the description clear.

Figure 2:
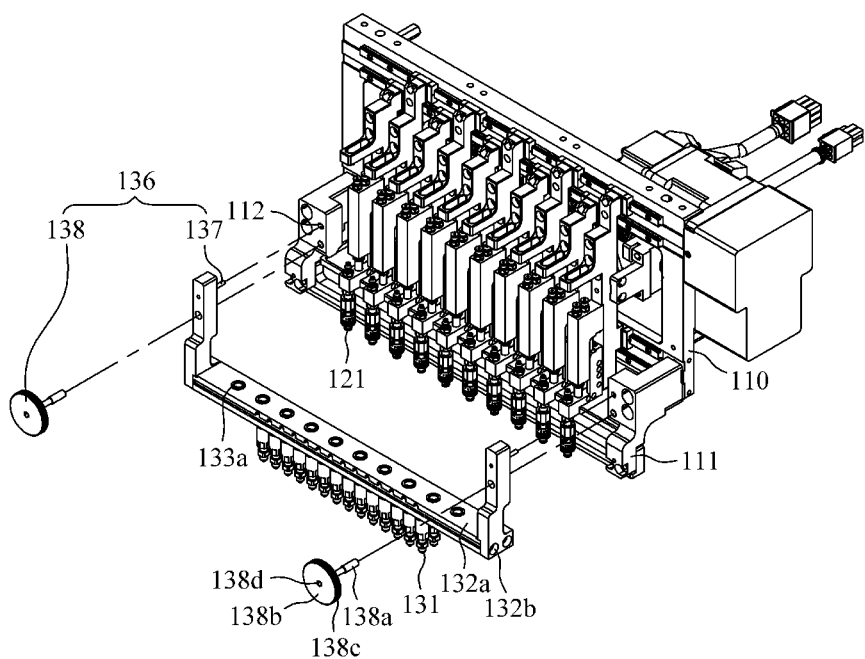
FIG. 2 is an exploded perspective view of FIG. 1.
Figure 3:
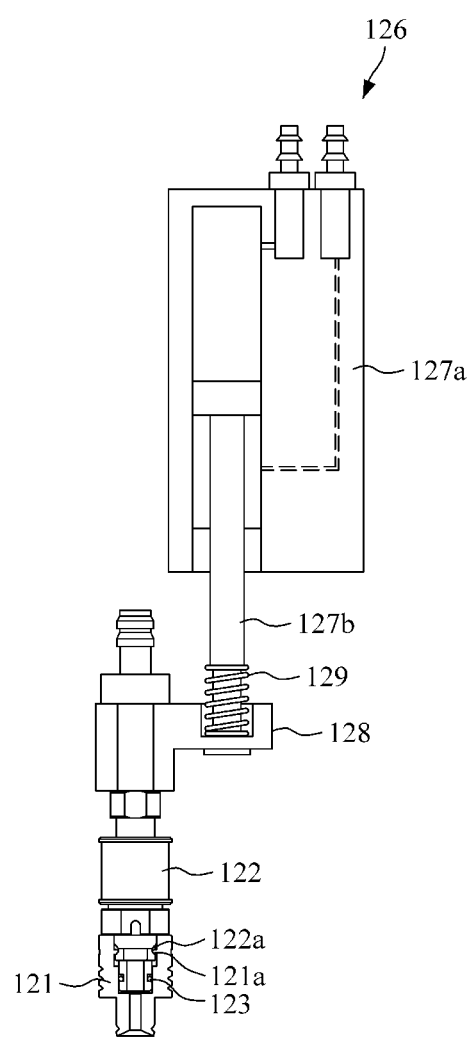
FIG. 3 is a cross-sectional view of a picker shown in FIG. 1.
Figure 4:
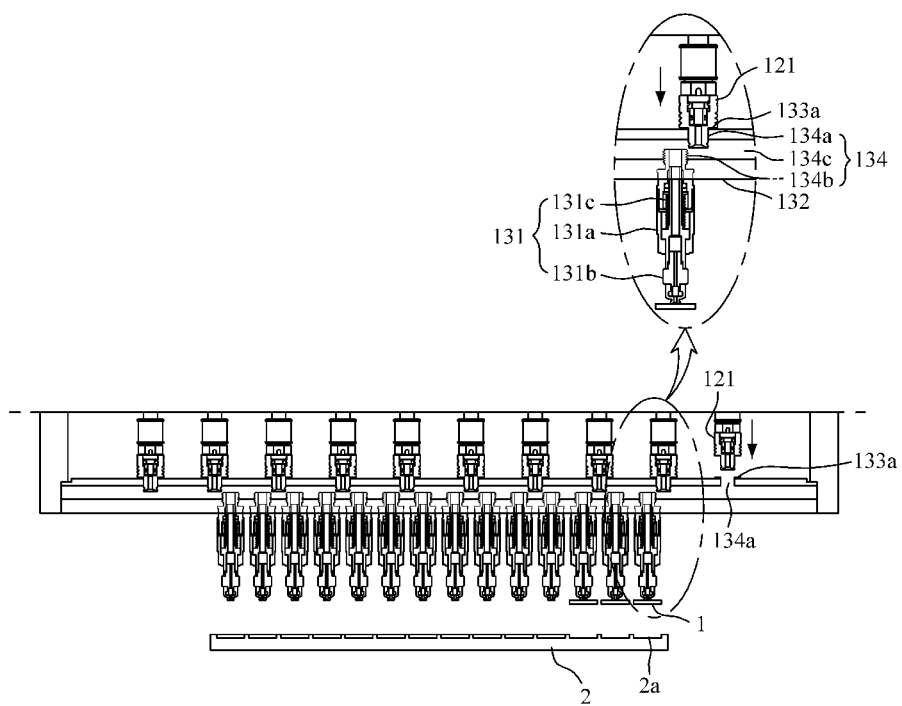
FIG. 4 is a front cross-sectional view of FIG. 1.

FIG. 1 is a perspective view of a picker device according to one embodiment of the present invention. FIG. 2 is an exploded perspective view of FIG. 1. FIG. 3 is a cross-sectional view of a picker shown in FIG. 1. FIG. 4 is a front cross-sectional view of FIG. 1.

Referring to FIGS. 1 to 4, a picker device 100 according to one embodiment of the present invention includes a picker support 110, pickers 120, and a sub-nozzle docking module 130.

The picker support 110 supports the pickers 120. The pickers 120 are arranged in a line on the picker support 110. The pickers 120 are all arranged in a line in the same posture and supported on the picker support 110. Each picker 120 includes a main nozzle 121 and a lift actuator 126.

Vacuum pressure is applied to or released from a lower end of the main nozzle 121. Vacuum pressure is applied to the lower end of the main nozzle 121 by a vacuum pressure generator, and the vacuum pressure applied to the lower end by the vacuum pressure generator may be released. The main nozzle 121 may adsorb or desorb a transfer target object 1 at the lower end in a state of being undocked from the sub-nozzle docking module 130. Here, the transfer target object 1 may correspond to a semiconductor element or the like that is tested while accommodated in a tray 2.

A nozzle lift body 122 may be mounted on an upper end of the main nozzle 121. The nozzle lift body 122 may be elevated by the lift actuator 126 to elevate the main nozzle 121. The nozzle lift body 122 may be connected to the vacuum pressure generator to receive vacuum pressure and transmit the vacuum pressure to the main nozzle 121 through an internal passage.

The main nozzle 121 may be attached to or detached from the nozzle lift body 122. Accordingly, the main nozzle 121 may be easily replaced according to a change in type of the transfer target object 1, damage thereto, or the like. For example, the main nozzle 121 may be attached to or detached from the nozzle lift body 122 in a one-touch method, thereby increasing convenience.

An upper portion of the main nozzle 121 may be formed such that a lower portion of the nozzle lift body 122 is inserted therein. Fixing protrusions 121a may be formed on any one of the upper portion of the main nozzle 121 and the lower portion of the nozzle lift body 122, and fixing grooves 122a for fixing the fixing protrusions 121a may be formed in the other thereof. The lower portion of the nozzle lift body 122 may be inserted into the upper portion of the main nozzle 121 through a sealing material 123 to prevent a leakage of vacuum pressure.

The lift actuator 126 elevates the main nozzle 121 in a state of being supported on the picker support 110. Accordingly, the main nozzle 121 may be lowered by the lift actuator 126 and docked to a docking mount 132 of the sub-nozzle docking module 130 and may be lifted by the lift actuator 126 and undocked from the docking mount 132. In addition, when the main nozzle 121 directly picks up or puts down the transfer target object 1 in a state of being undocked from the docking mount 132, the main nozzle 121 may be elevated by the lift actuator 126.

The lift actuators 126 may independently elevate the corresponding main nozzles 121. Accordingly, the main nozzles 121 may independently pick up and transfer the transfer target object 1 in a state of being undocked from the docking mount 132. The lift actuator 126 may include a pneumatic cylinder 127.

The pneumatic cylinder 127 may be a double-acting pneumatic cylinder. The double-acting pneumatic cylinder is formed such that a cylinder rod 127b is expanded or contracted with respect to a cylinder body 127a by compressed air selectively supplied by supply ports in both inner spaces of the cylinder body 127a.

The cylinder body 127a may be supported on the picker support 110 in a posture in which the cylinder rod 127b expands or contracts at a lower side thereof. The cylinder rod 127b is connected to the nozzle lift body 122 through a connection bracket 128 and is expanded or contracted to elevate the nozzle lift body 122, thereby elevating the main nozzle 121.

The main nozzle 121 may be supported by the lift actuator 126 through a buffer member 129 to be buffered when docked to the docking mount 132. The buffer member 129 may be mounted between the connection bracket 128 and the cylinder rod 127b to support the connection bracket 128 and the cylinder rod 127b with an elastic force.

The sub-nozzle docking module 130 is docked to or undocked from the main nozzles 121. The sub-nozzle docking module 130 includes one or more sub-nozzles 131, the docking mount 132, and an attachment/detachment mechanism 136.

As vacuum pressure is applied to or released from a lower end of the sub-nozzle 131, the sub-nozzle 131 adsorbs or desorbs the transfer target object 1. As an example, the number of the sub-nozzles 131 may be greater than the number of main nozzles 121 such that an interval between the sub-nozzles 131 is less than an interval between the main nozzles 121 in an arrangement direction of the pickers 120.

The tray 2 is formed such that the number of tray pockets 2a in the arrangement direction of the pickers 120 is greater than the number of pickers 120 and an interval between the tray pockets 2a is less than a minimum interval between the main nozzles 121, thereby accommodating a plurality of small transfer target objects 1 such as small semiconductor elements. In this case, the sub-nozzles 131 may be provided in the same number as the number of tray pockets 2a in an arrangement direction of the main nozzles 121 and may be arranged at the same interval as the interval between the tray pockets 2a. The sub-nozzles 131 may be arranged in one or more lines.

For convenience of description, when a direction parallel to the arrangement direction of the pickers 120 is defined as an X-axis direction, and a direction perpendicular to the arrangement direction of the pickers 120 is defined as a Y-axis direction, an interval between the sub-nozzles 131 in the X-axis direction may be set to be the same as an interval between the tray pockets 2a in the X-axis direction. When the sub-nozzles 131 are provided in two or more lines, an interval between the sub-nozzles 131 in the Y-axis direction may be set to be the same as an interval between the tray pockets 2a in the Y-axis direction.

Accordingly, the sub-nozzles 131 are in one-to-one correspondence with the small transfer target objects 1 accommodated in the tray 2 at an interval that is less than the minimum interval between the main nozzles 121, thereby stably transferring the small transfer target objects 1 by picking up at least one line of the small transfer target objects 1 at a time. The sub-nozzle 131 may be supported to be elevated in a state in which a tip 131b is inserted into a lower end portion of a body 131a, and the tip 131b may be formed to receive an elastic force downward from a spring 131c. Accordingly, the sub-nozzle 131 may serve as a buffer when the transfer target object 1 is adsorbed.

In a state in which the docking mount 132 supports the sub-nozzles 131 at a lower end portion thereof and is docked to the main nozzles 121, the docking mount 132 receives vacuum pressure from the main nozzles 121 to transmit the vacuum pressure to the sub-nozzles 131 through a vacuum passage 134. The docking mount 132 may fix the sub-nozzles 131 in a state in which upper portions of the sub-nozzles 131 are inserted into outlet ports provided at the lower end portion thereof. Here, in the docking mount 132, portions into which the sub-nozzles 131 are inserted are sealed by a sealing material or the like to prevent a leakage of vacuum pressure.

Lower portions of the main nozzles 121 may be inserted into or separated from inlet ports of an upper end portion of the docking mount 132. Here, the main nozzles 121 stand by upon being lifted to a higher level than a mounting height of the docking mount 132 by the lift actuators 126. In this state, when the docking mount 132 is mounted on the picker support 110 by the attachment/detachment mechanism 136, the main nozzles 121 may each be lowered from a standby position and inserted into the inlet ports of the docking mount 132.

The lower portion of the main nozzle 121 may have an outer diameter that is less than that of an upper portion thereof and may be inserted into the inlet port of the docking mount 132. The docking mount 132 may include a packing material 133a for sealing the lower portion of the main nozzle 121 in a state of being inserted into the inlet port. The packing material 133c may also perform a buffering function when the main nozzle 121 is lowered and inserted into the inlet port of the docking mount 132.

The vacuum passage 134 of the docking mount 132 may be formed to equally transmit vacuum pressure provided from the main nozzles 121 to the sub-nozzles 131. The vacuum passage 134 may include inlet passages 134a extending from the inlet ports, outlet passages 134b extending from the outlet ports, and a connection passage 134c for connecting the inlet passages 134a to all communicate with the outlet passages 134b.

Accordingly, the docking mount 132 may equally divide vacuum pressure, which is provided from the main nozzles 121 through the inlet passages 134a, to the outlet passages 134b through the connection passage 134c to transmit the vacuum pressure to the sub-nozzles 131. Accordingly, all of the sub-nozzles 131 can pick up the transfer target objects 1 with the same vacuum pressure. As another example, although not shown, the outlet passages 134b may be divided into groups as many as the number of inlet passages 134a, and the connection passage 134c may be formed to connect the outlet passages 134b of each group to each inlet passage 134a assigned to each group.

The docking mount 132 may include a mount body 132a and a pair of mount blocks 132b. The mount body 132a supports the sub-nozzles 131 at a lower end portion thereof. The mount blocks 132b are attached to or detached from the picker support 110 by the attachment/detachment mechanism 136 in a state of being coupled to both sides of the mount body 132a. The mount blocks 132b may be detachably coupled to the mount body 132a through bolting or the like. Therefore, the sub-nozzle docking module 130 can be used by replacing only the mount body 132a when the sub-nozzle 131 is replaced.

The picker support 110 may include support blocks 111 supporting both portions of the docking mount 132, that is, outer surfaces of the mount blocks 132b through surface contact therewith. Accordingly, the docking mount 132 may be guided between the support blocks 111 and may be stably supported through surface contact between the support blocks 111 and the mount blocks 132b.

The attachment/detachment mechanism 136 attaches or detaches the docking mount 132 to or from the picker support 110. The attachment/detachment mechanism 136 may include reference pins 137 and coupling knobs 138. The reference pins 137 may each protrude from the docking mount 132 and may be inserted into reference grooves 112 of the picker support 110, thereby aligning the docking mount 132 at a reference position relative to the picker support 110.

Accordingly, the docking mount 132 may always be assembled to the picker support 110 at the same position. A cross-sectional area of each of the reference pin 137 and the reference groove 112 may be formed in various shapes such as a circular shape or a polygonal shape. The reference pins 137 are formed in pairs, and thus the reference grooves 112 may also be formed in pairs. As another example, the reference pins 137 may be formed in the picker support 110, and the reference grooves 112 may be formed in the docking mount 132.

The coupling knobs 138 attach or detach the docking mount 132 to or from the picker support 110 when each screw coupling portion 138a passes through the docking mount 132 and is screwed to or unscrewed from the picker support 110. The coupling knob 138 may include a circular head 138b fixed coaxially to the screw coupling portion 138a. An anti-slip portion 138c may be formed on an outer peripheral portion of the circular head 138b.

An operator can rotate the circular head 138b without slipping due to the anti-slip portion 138c while the outer peripheral portion of the circular head 138b is held in the operator's hand. The anti-slip portion 138c may have a concave-convex structure. A wrench groove 138d may be formed in a central portion of the circular head 138b. The wrench groove 138d may be formed as a hexagonal groove or the like.

Therefore, when an operator mounts the docking mount 132 on the picker support 110, while holding the anti-slip portion 138c of the circular head 138b in his or her hand, the operator can rotate the circular head 138b to temporarily couple the screw coupling portion 138a to the picker support 110 and then can insert a wrench rod into the wrench groove 138d to rotate the wrench rod and completely tighten the screw coupling portion 138a to the picker support 110.

When an operator separates the docking mount 132 from the picker support 110, the operator can insert a wrench rod into the wrench groove 138d to rotate the wrench rod and temporarily loosen the screw coupling portion 138a from the picker support 110 and then can rotate the circular head 138b to completely loosen the screw coupling portion 138a from the picker support 110 while holding the anti-slip portion 138c of the circular head 138b in his or her hand.

Figure 5:
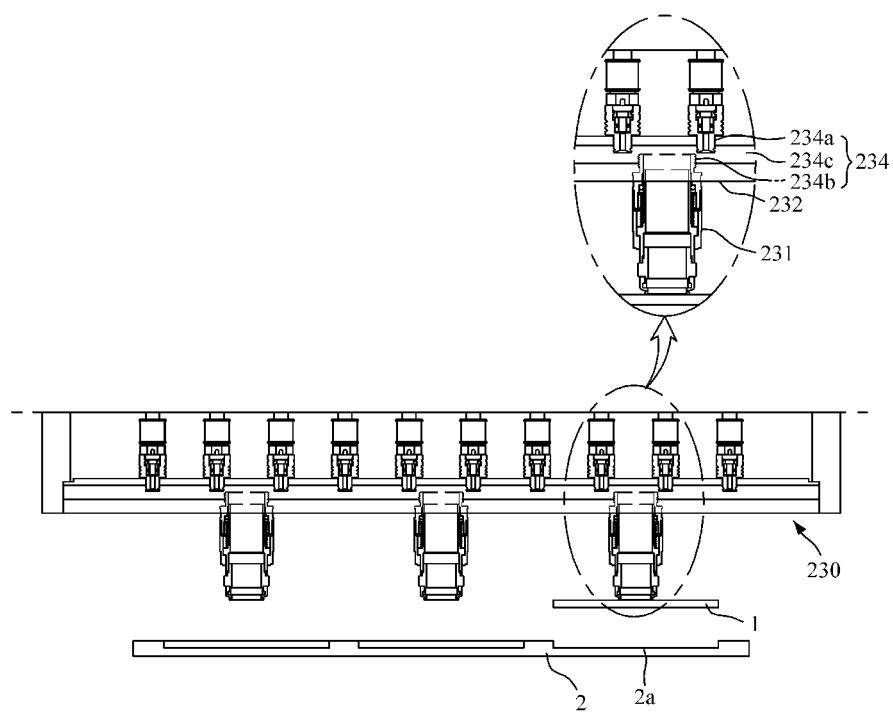
FIG. 5 is a front cross-sectional view illustrating another example of a sub-nozzle docking module.

As another example, as shown in FIG. 5, in a sub-nozzle docking module 230, the number of sub-nozzles 231 may be less than the number of main nozzles 121 in an arrangement direction of pickers 120. A tray 2 is formed such that the number of tray pockets 2a in the arrangement direction of the pickers 120 is less than the number of pickers 120 and an interval between tray pockets 2a is greater than a maximum interval between the main nozzles 121, thereby accommodating a plurality of large transfer target objects 1 such as large semiconductor elements.

In this case, the sub-nozzles 231 may be provided in the same number as the number of tray pockets 2a in an arrangement direction of the main nozzles 121 and may be arranged at the same interval as an interval between the tray pockets 2a. The sub-nozzles 231 may be arranged in one or more lines. Accordingly, the sub-nozzles 231 are in one-to-one correspondence with the large transfer target objects 1 which are accommodated in the tray 2 at an interval greater than the maximum interval between the main nozzles 121, thereby stably transferring the large transfer target objects 1 by picking up at least one line of the large transfer target objects 1 at a time.

A vacuum passage 234 of a docking mount 232 may be formed to equally transmit vacuum pressure provided from the main nozzles 121 to the sub-nozzles 231. The vacuum passage 234 may include inlet passages 234a extending from inlet ports of the docking mount 232, outlet passages 234b extending from outlet ports of the docking mount 232, and a connection passage 234c for connecting the inlet passages 234a to all communicate with the outlet passages 234b.

Accordingly, the docking mount 232 may equally divide vacuum pressure, which is provided from the main nozzles 121 through the inlet passages 234a, to the outlet passages 234b through the connection passage 234c to transmit the vacuum pressure to the sub-nozzles 231. Accordingly, all of the sub-nozzles 231 can pick up the transfer target objects 1 with the same vacuum pressure. As another example, although not shown, the inlet passages 234a may be divided into groups as many as the number of outlet passages 234b, and the connection passage 234c may be formed to connect the inlet passages 234a of each group to each outlet passage 234b assigned to each group.

As described above, according to the picker device 100 of the present embodiment, when the small transfer target objects 1 are accommodated in the tray 2 at an interval less than the interval between the main nozzles 121 or the large transfer target objects 1 are accommodated in the tray 2 at an interval greater than the interval between the main nozzles 121, only the sub-nozzle docking module 130 or 230 suitable for each situation is replaced without any change in configuration of the main nozzles 121, thereby stably picking up and transferring the corresponding transfer target objects 1. Accordingly, the picker device 100 of the present embodiment can flexibly cope with a situation in which the transfer target object 1 is accommodated in the tray 2.

Figure 6:
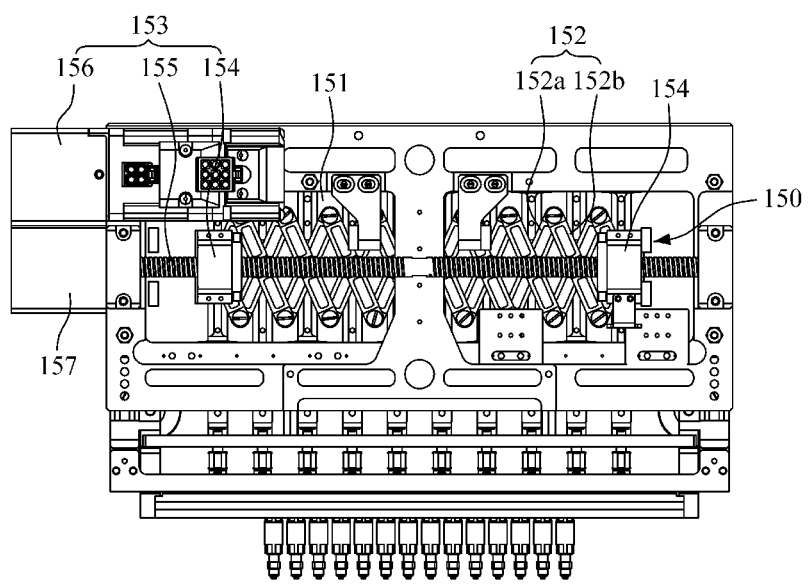
FIG. 6 is a rear view of the picker device shown in FIG. 1.

Meanwhile, referring to FIG. 6 together with FIGS. 1 and 2, the picker device 100 may include a pitch variation mechanism 150 which varies a pitch between the pickers 120 in a state in which the sub-nozzle docking module 130 is undocked from the pickers 120. The pitch variation mechanism 150 varies a pitch between the main nozzles 121 according to a pitch between the transfer target objects 1, for example, a pitch between semiconductor elements accommodated in the tray 2. The pitch variation mechanism 150 includes variable moving bodies 151, a foldable link 152, and a link actuator 153.

The variable moving bodies 151 are fixed to the pickers 120 in a state of being spaced from each other. The variable moving bodies 151 may be fixed to the lift actuators 126. The variable moving bodies 151 are slidably supported on the picker support 110 by a linear guide 151a in a horizontal direction parallel to the arrangement direction of the pickers 120.

The foldable link 152 may include first link members 152a hinge-coupled in a zigzag shape and second link members 152b which are hinge-coupled in a zigzag shape and of which central portions are hinge-coupled to and symmetrically intersect central portions of the first link members 152a. The hinge-coupled central portions of the first link members 152a and the second link members 152b may be fixed to the variable moving bodies 151.

In the foldable link 152, when hinge-coupled portions of the first link members 152a are folded, and concurrently, hinge-coupled portions of the second link members 152b are folded, the hinge-coupled central portions of the first link members 152a and the second link members 152b move toward or away from each other, and thus the pitch between the pickers 120 can decrease or increase. As a result, the pitch between the main nozzles 121 can be varied.

The link actuator 153 folds the foldable link 152. The link actuator 153 may include a pair of horizontal moving bodies 154, a horizontal screw 155, and a rotation motor 156.

The horizontal moving bodies 154 are fixed to the variable moving bodies 151 at both outermost sides. The horizontal screw 155 is elongated and horizontally disposed in the arrangement direction of the pickers 120 to be rotatably supported on the picker support 110. The horizontal screw 155 is screw-coupled to each of the horizontal moving bodies 154. The horizontal screw 155 may move the horizontal moving bodies 154 toward or away from each other in a rotational direction to fold the foldable link 152.

The rotation motor 156 provides a forward or reverse rotational force to the horizontal screw 155. The forward or reverse rotational force of the rotation motor 156 may be transmitted to the horizontal screw 155 by a power transmitter 157. The power transmitter 157 may include a driving pulley coaxially fixed to a driving shaft of the rotation motor 156, a driven pulley coaxially fixed to the horizontal screw 155, and a belt disposed over the driving pulley and the driven pulley to transmit the rotation of the driving pulley to the driven pulley. The pitch variation mechanism 150 may have various known configurations.

Although not shown, the picker device 100 may adjust a height of the pickers 120 by elevating the pickers 120 together through a picker lift mechanism. The picker lift mechanism may elevate the main nozzles 121 together by elevating the picker support 110. The picker lift mechanism may include a typical linear actuator.

The picker device 100 may allow the pickers 120 to horizontally reciprocate together in the arrangement direction of the pickers 120 through a picker horizontal movement mechanism. The picker horizontal movement mechanism may allow the main nozzles 121 to horizontally reciprocate together by allowing the picker lift mechanism to horizontally reciprocate. The picker horizontal movement mechanism may include a typical linear actuator.

Figure 7:
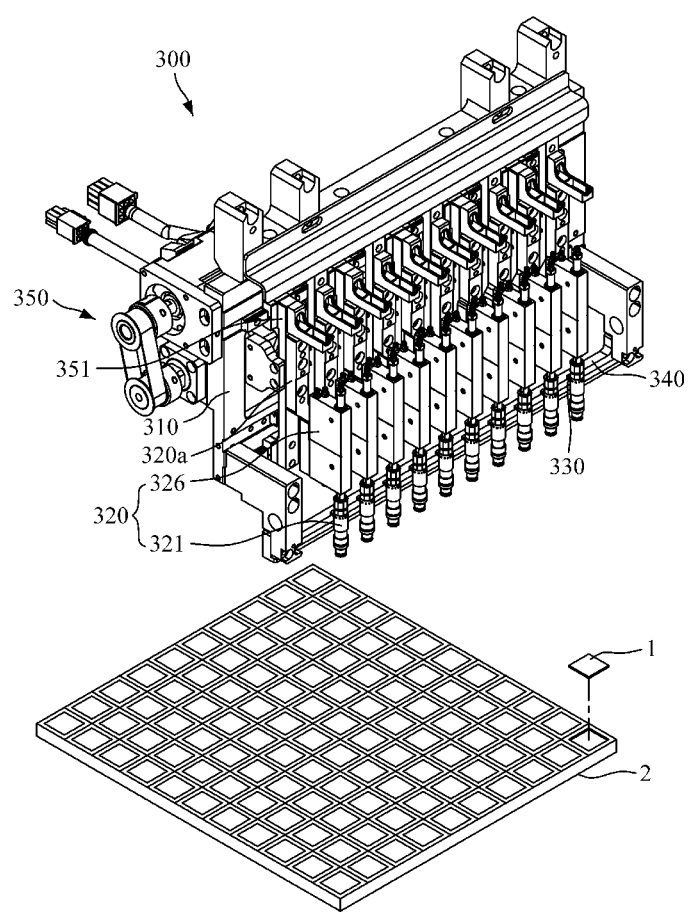
FIG. 7 is a perspective view of a picker device according to another embodiment of the present invention.
Figure 8:
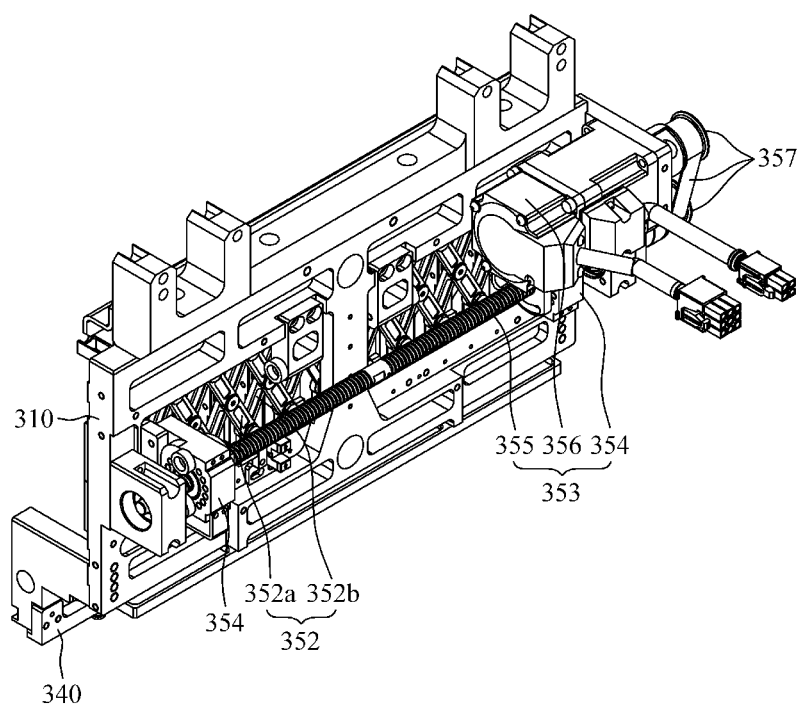
FIG. 8 is a perspective view illustrating the rear of the picker device shown in FIG. 7.
Figure 9:
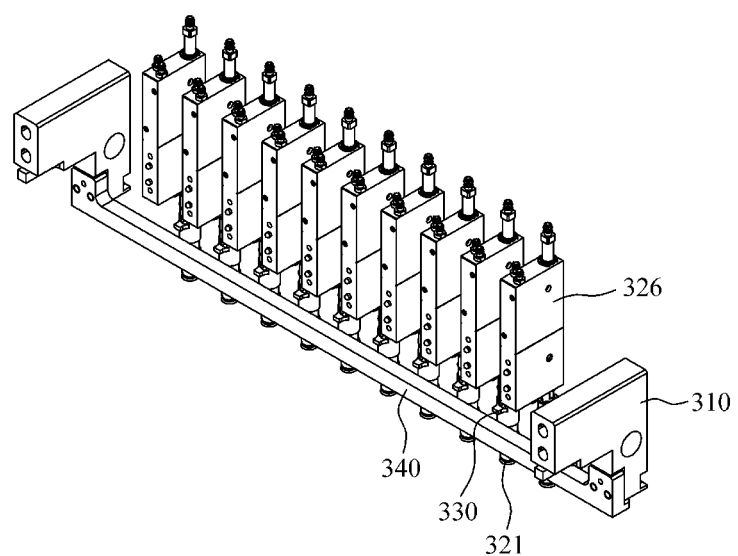
FIG. 9 is a perspective view illustrating pickers and a stopper of FIG. 7.
Figure 10:
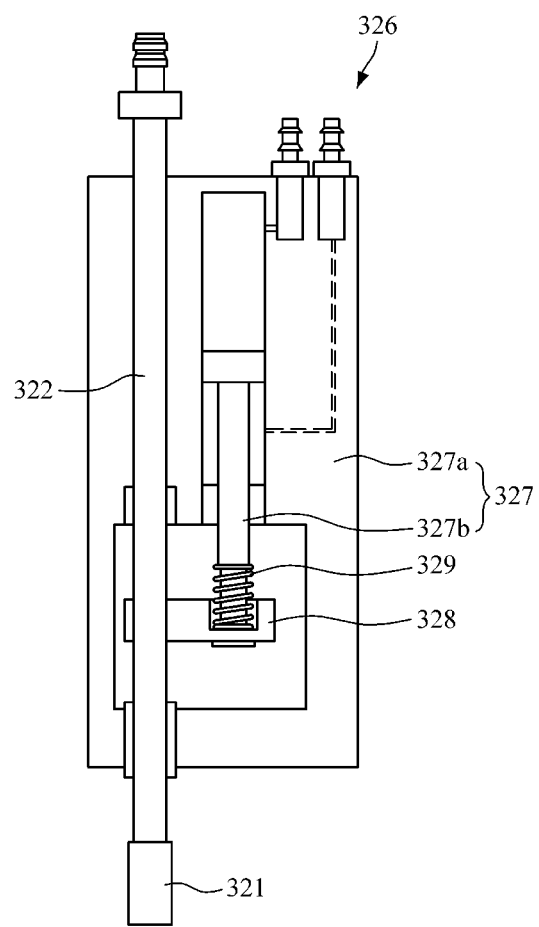
FIG. 10 is a cross-sectional view of the picker.
Figure 11:
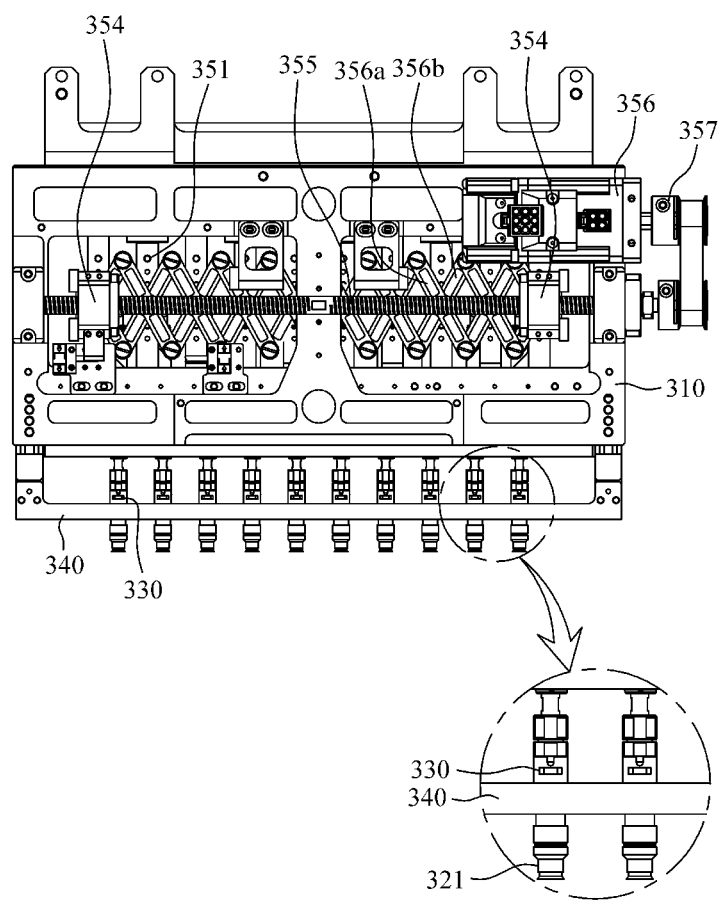
FIG. 11 is a rear view of FIG. 7.
Figure 12:
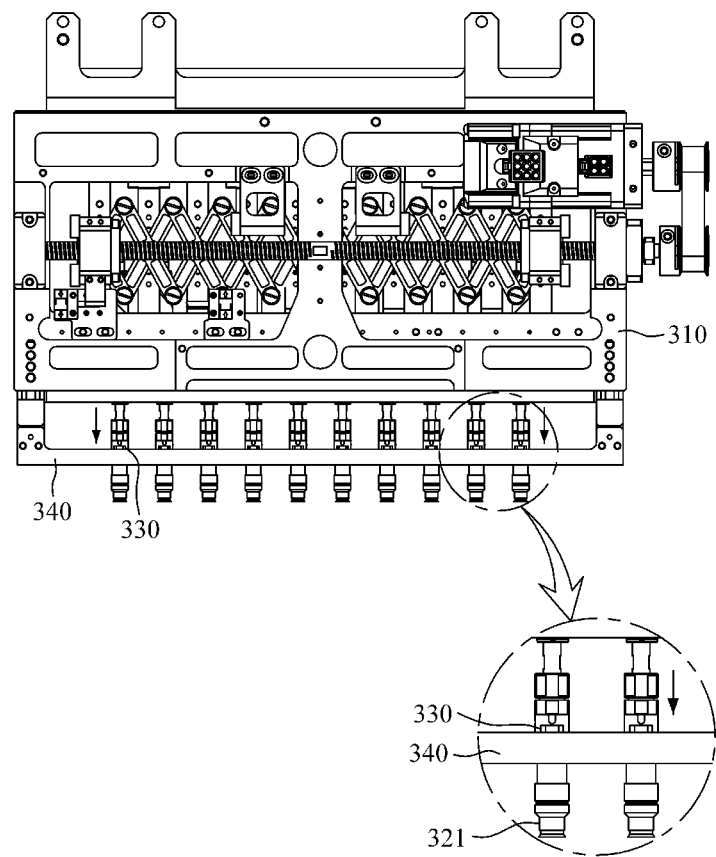
FIG. 12 is a view for describing operations of locking protrusions and the stopper of FIG. 11.

FIG. 7 is a perspective view of a picker device according to another embodiment of the present invention. FIG. 8 is a perspective view illustrating the rear of the picker device shown in FIG. 7. FIG. 9 is a perspective view illustrating pickers and a stopper of FIG. 7. FIG. 10 is a cross-sectional view of the picker. FIG. 11 is a rear view of FIG. 7. FIG. 12 is a view for describing operations of locking protrusions and the stopper of FIG. 11.

Referring to FIGS. 7 to 12, a picker device 300 according to one embodiment of the present invention includes a picker support 310, pickers 320, locking protrusions 330, and a stopper 340.

The picker support 310 supports the pickers 320. The pickers 320 are all arranged in a line in the same posture and supported on the picker support 310. Each picker 320 includes a main nozzle 321 and a lift actuator 326.

The main nozzle 321 adsorbs or desorbs a transfer target object 1 through a lower end thereof. The main nozzle 321 may receive negative pressure from a pneumatic supply to adsorb the transfer target object 1 and may receive positive pressure from the pneumatic supply to desorb the transfer target object 1.

A nozzle lift body 322 may be mounted on an upper end of the main nozzle 321. The nozzle lift body 322 may be elevated and supported by the lift actuator 326 to guide the main nozzle 321 to be elevated. The nozzle lift body 322 may be connected to the pneumatic supply to receive negative or positive pressure from the pneumatic supply and transfer the negative or positive pressure to the main nozzle 321 through an internal flow path.

The lift actuator 326 elevates the main nozzle 321 in a state of being supported on the picker support 310. In addition, when the main nozzle 321 picks up or puts down the transfer target object 1, the main nozzle 321 may be elevated by the lift actuator 326. In addition, the main nozzle 321 may be lowered by the lift actuator 326 in a state in which the transfer target object 1 is picked up, thereby allowing a test to be performed on the transfer target object 1 in a state in which a minimum height of the main nozzle 321 is limited by the locking protrusion 330 and the stopper 340.

The lift actuators 326 may independently elevate the corresponding main nozzles 321. Accordingly, the main nozzles 321 may independently pick up and transport the transfer target object 1. The lift actuator 326 may include a pneumatic cylinder 327.

The pneumatic cylinder 327 may be a double-acting pneumatic cylinder. The double-acting pneumatic cylinder is formed such that a cylinder rod 327*b* is expanded or contracted with respect to a cylinder body 327*a* by compressed air selectively supplied by supply ports in both inner spaces of the cylinder body 327*a*.

The cylinder body 327*a* may be supported on the picker support 310 in a posture in which the cylinder rod 327*b* expands or contracts at a lower side thereof. A nozzle lift body 322 may vertically pass through one side of the cylinder body 327*a* and thus may be supported to be elevated. The cylinder rod 327*b* is connected to the nozzle lift body 322 through a connection bracket 328 and is expanded or contracted to elevate the nozzle lift body 322, thereby elevating the main nozzle 321.

The main nozzle 321 may be supported by the lift actuator 326 through a buffer member 329 to be buffered when the corresponding locking protrusion 330 is caught by the stopper 340. When the connection bracket 328 is fixed to the nozzle lift body 322 and the cylinder rod 327*b* is supported to be elevatable, the buffer member 329 may be mounted between the connection bracket 328 and the cylinder rod 327*b* to support the connection bracket 328 and the cylinder rod 327*b* with an elastic force.

As another example, when the connection bracket 328 is fixed to the cylinder rod 327*b* and supports the nozzle lift body 322 to be elevatable, the buffer member 329 may be mounted between the connection bracket 328 and the nozzle lift body 322 to support the connection bracket 328 and the nozzle lift body 322 with an elastic force. The buffer member 329 may be formed as a coil spring or the like.

The locking protrusions 330 are formed at the same level in the main nozzles 321. The locking protrusions 330 are formed to protrude from side portions of the main nozzles 321 in the same direction. The locking protrusion 330 is caught by the stopper 340 when the main nozzle 321 is lowered, thereby limiting a minimum height of the main nozzle 321 together with the stopper 340.

A lower surface of the locking protrusion 330 may be formed in a flat shape parallel to a horizontal surface to be in stable contact with an upper surface of the stopper 340. The locking protrusion 330 may be more firmly connected to the main nozzle 321 because a portion thereof connected to the main nozzle 321 has a relatively wide width. The locking protrusion 330 may be integrally formed with the main nozzle 321 but may be separately manufactured and assembled to the main nozzle 321.

The stopper 340 is mounted on the picker support 310 to catch the locking protrusions 330 thereunder to equally limit the minimum heights of the main nozzles 321 when the main nozzles 321 are lowered by the lift actuators 326. The stopper 340 may have a shape horizontally elongated in an arrangement direction of the main nozzles 321, and both end portions thereof are fixed by the picker support 310, thereby allowing the locking protrusions 330 of the main nozzles 321 to be commonly caught.

The upper surface of the stopper 340 may be formed in a flat shape parallel to a horizontal plane, thereby allowing all of the locking protrusions 330 to be caught at the same level. Accordingly, the upper surface of the stopper 340 serves as a reference for limiting the minimum height of each of the main nozzles 321.

The stopper 340 may be made of a material, such as a metal, which is strong against deformation when pressed by the locking protrusions 330. The stopper 340 is illustrated in a shape in which a central portion has a constant cross-sectional area in a longitudinal direction but may be formed in a shape that is strong against deformation, such as a shape in which a lower portion is expanded from both edges toward a center. The stopper 340 has both ends bolted to the picker support 310 and thus can be easily replaced.

As described above, according to the present embodiment, even when there is some height deviation between the main nozzles 321 due to various factors such as an assembly error of each of the pickers 320 with respect to the picker support 310 or an assembly error of the picker 320 itself, minimum height of the main nozzles 321 may be set to be have the same due to an interaction between the locking protrusions 330 and the stopper 340. In addition, according to the present embodiment, when only a height of each of the locking protrusions 330 and the stopper 340 is managed, the minimum heights of the main nozzles 321 can be set to be the same, thereby easily managing the heights of the main nozzles 321.

In a further aspect, the picker device 300 may include a pitch variation mechanism 350 for varying a pitch between the pickers 320 as in the above-described embodiment. The pitch variation mechanism 350 includes variable moving bodies 351, a foldable link 352, and a link actuator 353. The variable moving bodies 351 may be fixed to the lift actuators 326 through picker brackets 320a.

The foldable link 352 may include first link members 352a hinge-coupled in a zigzag shape and second link members 352b which are hinge-coupled in a zigzag shape and of which central portions are hinge-coupled to and symmetrically intersect central portions of the first link members 352a.

The link actuator 353 may include a pair of horizontal moving bodies 354, a horizontal screw 355, and a rotation motor 356. A forward or reverse rotational force of the rotation motor 356 may be transmitted to the horizontal screw 355 by a power transmitter 357.

Although not shown, the picker device 300 may adjust a height of the pickers 320 by elevating the pickers 320 together through a picker lift mechanism. The picker lift mechanism may elevate the main nozzles 321 together by elevating the picker support 310.

The picker device 300 may allow the pickers 320 to horizontally reciprocate together in an arrangement direction of the pickers 320 through a picker horizontal movement mechanism. The picker horizontal movement mechanism may allow the main nozzles 321 to horizontally reciprocate together by allowing the picker lift mechanism to horizontally reciprocate.

An operation example of the above-described picker device 300 will be described with reference to FIG. 13 as follows.

Figure 13:
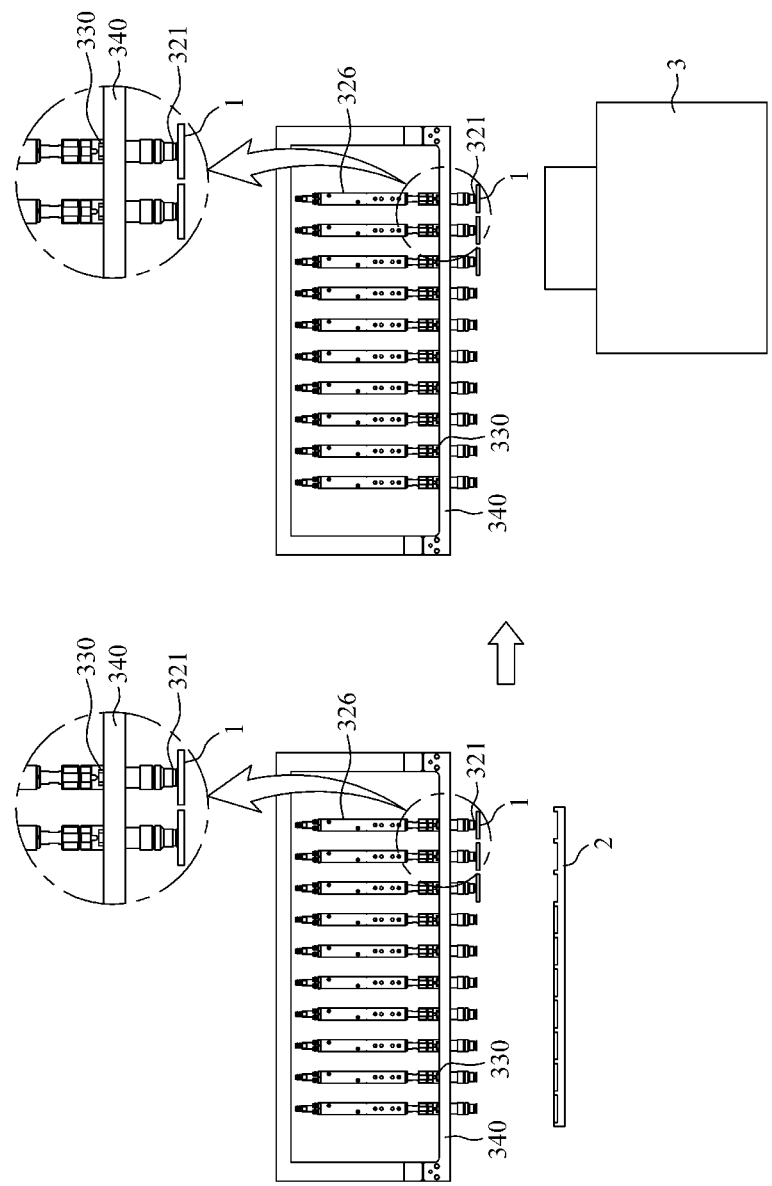
FIG. 13 shows views for describing a process in which transfer target objects are inspected using a vision inspector in a state of being picked up by pickers.

As shown in FIG. 13, the pickers 320 are lowered by the picker lift mechanism and the lift actuators 326 above a tray 2 to pick up the transfer target objects 1 accommodated in the tray 2, such as semiconductor elements, through the main nozzles 321. In such a process, the locking protrusions 330 of the main nozzles 321 are each caught by the stopper 340 so that minimum heights of the main nozzles 321 are equally limited.

In this state, after the pickers 320 are transferred to a vision inspector 3 by the picker horizontal movement mechanism, the semiconductor elements may be inspected using the vision inspector 3 in a state of being picked up by the main nozzles 321 of which minimum heights are set to be the same. In this case, since the semiconductor elements are all positioned at the same level with respect to a camera photographing portion of the vision inspector 3, all of the semiconductor elements can be focused on a camera to be photographed clearly. As a result, the inspection of the semiconductor elements can be accurately performed.

Although the present invention has been described with reference to embodiments shown in the accompanying drawings, the embodiments are merely examples, and those skilled in the art will appreciate that various modifications and equivalent other embodiments are possible therefrom. Therefore, the true technical protection scope of the present invention should be determined only by the appended claims.

The invention claimed is:
1. A picker device comprising:
a picker support;
pickers which are arranged in a line on the picker support and each comprising main nozzles to which vacuum pressure is applied to or released from a lower end thereof and a lift actuator supported on the picker support to elevate the main nozzles; and
a sub-nozzle docking module which is docked to or undocked from the main nozzles and comprising:
one or more sub-nozzles configured to adsorb or desorb transfer target objects when vacuum pressure is applied to or released from lower ends thereof;
a docking mount configured to support the sub-nozzles at a lower end portion thereof to receive the vacuum pressure from the main nozzles in a state of being docked to the main nozzles and transmit the vacuum pressure to the sub-nozzles through a vacuum passage; and
an attachment/detachment mechanism configured to attach and detach the docking mount to and from the picker support,
wherein a number of the sub-nozzles is greater than a number of the main nozzles such that an interval between the sub-nozzles is less than an interval between the main nozzles in an arrangement direction of the pickers, and
wherein the vacuum passage of the docking mount is configured to equally transmit the vacuum pressure provided from the main nozzles to the sub-nozzles.
2. A picker device comprising:
a picker support;
pickers arranged in a line on the picker support and each comprising main nozzles to which vacuum pressure is applied to or released from a lower end thereof and a lift actuator supported on the picker support to elevate the main nozzles; and
a sub-nozzle docking module which is docked to or undocked from the main nozzles and comprising:
one or more sub-nozzles configured to adsorb or desorb transfer target objects when vacuum pressure is applied to or released from lower ends thereof;
a docking mount configured to support the sub-nozzles at a lower end portion thereof to receive the vacuum pressure from the main nozzles in a state of being docked to the main nozzles and transmit the vacuum pressure to the sub-nozzles through a vacuum passage; and
an attachment/detachment mechanism configured to attach and detach the docking mount to and from the picker support,
wherein a number of the sub-nozzles is less than a number of the main nozzles such that an interval between the sub-nozzles is greater than an interval between the main nozzles in an arrangement direction of the pickers; and
wherein the vacuum passage of the docking mount is configured to equally transmit the vacuum pressure provided from the main nozzles to the sub-nozzles.
3. The picker device of claim 1,
wherein the attachment/detachment mechanism comprises reference pins which protrude from the docking mount, respectively, and are inserted into reference grooves of the picker support to align the docking mount at a reference position relative to the picker support; and
wherein coupling knobs which attach or detach the docking mount to or from the picker support when screw coupling portions thereof pass through the docking mount and are screwed to or unscrewed from the picker support.

4. The picker device of claim 1, comprising:

locking protrusions formed at the same level in the main nozzles; and a stopper mounted on the picker support to catch the locking protrusions thereunder to equally limit minimum heights of the main nozzles when the main nozzles are lowered by the lift actuators.

5. The picker device of claim 4, wherein the lift actuator includes a pneumatic cylinder.

6. The picker device of claim 4, wherein the main nozzles are supported by the lift actuator through a buffer member to be buffered when the locking protrusions are caught by the stopper.

7. The picker device of claim 4, comprising a pitch variation mechanism configured to vary a pitch between the pickers.

* * * * *